United States Patent [19]

Takimoto et al.

[11] Patent Number: 4,563,312
[45] Date of Patent: Jan. 7, 1986

[54] GAS SUPPLYING APPARATUS

[75] Inventors: Hiroaki Takimoto; Tetsuo Miyajiri; Kiminobu Yoshida; Tamio Turita, all of Yokohama, Japan

[73] Assignee: Sumitomo Electric Industries, Ltd., Osaka, Japan

[21] Appl. No.: 677,588

[22] Filed: Dec. 3, 1984

[30] Foreign Application Priority Data

Dec. 2, 1983 [JP] Japan .............................. 58-226750

[51] Int. Cl.⁴ .............................................. B01F 3/04
[52] U.S. Cl. ................................. 261/59; 261/121 R; 137/239
[58] Field of Search ....................... 261/121 R, 59, 60; 137/239

[56] References Cited

U.S. PATENT DOCUMENTS

| | | | |
|---|---|---|---|
| 2,178,559 | 11/1939 | Cohen et al. | 137/239 |
| 2,371,188 | 3/1945 | Russell | 137/239 |
| 2,882,539 | 4/1959 | Walz | 137/239 |
| 3,044,466 | 7/1962 | Henderson | 137/239 |
| 4,235,829 | 11/1980 | Partus | 261/121 R |
| 4,276,243 | 6/1981 | Partus | 261/121 R |
| 4,313,897 | 2/1982 | Garrard | 261/121 R |

Primary Examiner—Tim Miles
Attorney, Agent, or Firm—Cushman, Darby and Cushman

[57] ABSTRACT

A gas supply apparatus for supplying gaseous raw material of an article to a processing apparatus, including at least one main vessel for storing liquid raw material of the article and supplying the gaseous raw material to the processing apparatus, an auxiliary vessel for storing liquid raw material replenishment for the liquid raw material, a main pipe for delivering the liquid raw material replenishment to the main vessel, a return pipe branched form the main pipe, first and second control valves, and a feed device for feeding, through the main pipe, the liquid raw material replenishment to the main vessel.

12 Claims, 8 Drawing Figures

GAS SUPPLYING APPARATUS

BACKGROUND OF THE INVENTION

The present invention generally relates to gas supplying apparatuses and more particularly, to a gas supplying apparatus which supplies to a processing apparatus gaseous raw material including vapor of liquid raw material of an article so as to efficiently perform replenishment of the liquid raw material.

In order to manufacture a base material of optical fiber by employing VAD method, it is necessary to supply to an optical fiber reaction apparatus gaseous raw material of the optical fiber, which is constituted by carrier gas mixed with vapor of liquid raw material of the optical fiber, with the liquid raw material being silicon tetrachloride or gemanium tetrachloride.

Hereinbelow, a prior art gas supplying apparatus for supplying the gaseous raw material of the optical fiber to the optical fiber reaction apparatus will be described with reference to FIG. 1. As shown in FIG. 1, since a main vessel 2 containing liquid raw material 1 of the optical fiber is secured to a bottom portion of a constant temperature bath 3 directly or through a support base, the liquid raw material 1 is maintained at a predetermined temperature. Carrier gas 4 is introduced, through a pipe 6 provided with a flow regulator 5 and dipped into the liquid raw material 1 of the main vessel 2, into the liquid raw material 1 of the main vessel 2 so as to bubble the liquid raw material 1 as shown in FIG. 1. Thus, the carrier gas 4 is mixed with the liquid raw material 1 to a saturated state or an almost saturated state so as to be formed into gaseous raw material 7. The gaseous raw material 7 is supplied to the optical fiber raction apparatus via a pipe 8. Meanwhile, since the carrier gas 4 is not necessarily required to bubble the liquid raw material 1, it can be also so arranged that the carrier gas 4 is simply introduced over a liquid level of the liquid raw material 1 in the main vessel 2 so as to be mixed with vapor of the liquid raw material 1 into the gaseous raw material 7. The liquid raw material 1 for replenishment is stored in an auxiliary vessel 9 connected with a pipe 10. Furthermore, an inlet end 11a of a main pipe 11 is dipped in the liquid raw material 1 stored in the auxiliary vessel 9, while an outlet end 11b of the main pipe 11 is disposed in the main vessel 2 and above the liquid level of the liquid raw material 1 in the main vessel 2. Moreover, the known gas supplying apparatus includes control valves 12 to 18.

In the known gas supplying apparatus of FIG. 1, in order to supply the gaseous raw material 7 to the optical fiber reaction apparatus, the control valves 12 and 13 are opened. Meanwhile, when the gaseous raw material 7 is continuously supplied to the optical fiber reaction apparatus and thus, the liquid raw material 1 stored in the main vessel 2 decreases in amount, the main vessel 2 is replenished with the liquid raw material 1 stored in the axuiliary vessel 9. In order to replenish the main vessel 2 with the liquid raw material 1 stored in the auxiliary vessel 9, the control valves 14 and 17 are closed and the control valves 15, 16 and 18 are opened, while pressurized nitrogen gas 19 is fed into the auxiliary vessel 9 through the pipe 10. Thus, the main vessel 2 is replenished, through the main pipe 11, with the liquid raw material 1 in the auxiliary vessel 9 by the pressurized nitrogen gas 19. It is to be noted that the above described replenishment of the liquid raw material 1 into the main vessel 2 is referred to as a "primary replenishment", hereinbelow. When the main vessel 2 has been replenished with a predetermined amount of the liquid raw material 1 in the auxiliary vessel 9, the open control valves 16 and 18 are closed and the closed control valve 17 is opened. Thus, the liquid raw material 1 remaining in the main pipe 11 is fed under pressure into the main vessel 2 by the pressurized nitrogen gas 19. It is to be further noted that this replenishment of the liquid raw material 1 into the main vessel 2 is referred to as a "secondary replenishment", hereinbelow. Subsequently, when the control valve 15 is closed and the control valve 14 is opened, namely the control valves 15, 16 and 18 are closed and the control valves 14 and 17 are opened, the pressurized nitrogen gas 19 is further fed into the main pipe 11 so as to drive a small amount of the liquid raw material 1 remaining in the main pipe 11 out of the main pipe 11 through the control valve 14. Meanwhile, when the main vessel 2 is being replenished with the liquid raw material 1 stored in the auxiliary vessel 9, supply of the gaseous raw material 7 to the optical fiber reaction apparatus is stopped. Furthermore, although not specifically shown, it has been also so arranged that a plurality of the main vessels 2 are replenished with the liquid raw material 1 stored in the single auxiliary vessel 9.

However, the prior art gas supplying apparatus of FIG. 1 has the following drawbacks (1) and (2). (1) In the case where the single main vessel 2 is replenished with the liquid raw material 1 in the single auxiliary vessel 9:

A total replenishment amount of the liquid raw material 1 should be set on the basis of two replenishment amounts of the liquid raw material 1 based on the primary replenishment and the secondary replenishment, thereby resulting in difficulty in setting the total replenishment amount of the liquid raw material 1. Furthermore, in the case where the main pipe 11 is replaced with a new one having a length and a diameter different from those of the main pipe 11, the replenishment amount of the liquid raw material 1 based on the secondary replenishment directly changes accordingly, so that it becomes necessary to set the total replenishment amount of the liquid raw material 1 again, which is a troublesome operation. (2) In the case where a plurality of the main vessels 2 are replenished with the liquid raw material 1 in the single auxiliary vessel 9:

Since a plurality of the main pipes 11 connecting the main vessels 2 and the auxiliary vessel 9, respectively have lengths different from one another, the replenishment amounts of the liquid raw material 1 for the respective main vessels 2 based on the secondary replenishment are different from one another. Accordingly, when amounts of the liquid raw material 1 in the respective main vessels 2 should be set at a predetermined value, the replenishment amounts of the liquid raw material 1 for the respective main vessels 2 based on the secondary replenishment are required to be set at different values for the main vessels 2, respectively, which is quite troublesome. Especially, in the case where a number of the main vessels 2 are scattered at various spots with the result that the long main pipes 11 are installed complicatedly, the above described disadvantage of the known gas supplying apparatus becomes quite serious.

SUMMARY OF THE INVENTION

Accordingly, an essential object of the present invention is to provide an improved gas supplying apparatus which supplies to a processing apparatus gaseous raw material including vapor of liquid raw material of an article so as to efficiently perform replenishment of the liquid raw material, with substantial elimination of the disadvantages inherent in conventional gas supplying apparatuses of this kind.

In accomplishing these and other objects according to one preferred embodiment of the present invention, there is provided an improved gas supplying apparatus for supplying gaseous raw material of an article to a processing apparatus, comprising: at least one main vessel for storing liquid raw material of said article, which generates said gaseous raw material constituted by vapor of said liquid raw material mixed with carrier gas drawn into said main vessel so as to supply said gaseous raw material to said processing apparatus; an auxiliary vessel for storing liquid raw material replenishment for said liquid raw material; a main pipe for delivering to said main vessel said liquid raw material replenishment stored in said auxiliary vessel, which has an inlet end an outlet end; said inlet end being dipped in said liquid raw material replenishment in said auxiliary vessel, while said outlet end is disposed in said main vessel; a return pipe having a distal end, which is branched, in the vicinity of said outlet end, from a branch portion of said main pipe such that said distal end is disposed in said auxiliary vessel and above a liquid level of said liquid raw material replenishment in said auxiliary vessel; a first control valve which is provided in said return pipe; a second control valve which is provided, between said outlet end and said branch portion, in said main pipe; and a feed means for feeding, through said main pipe, to said main vessel said liquid raw material replenishment in said auxiliary vessel.

BRIEF DESCRIPTION OF THE DRAWINGS

These and other objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
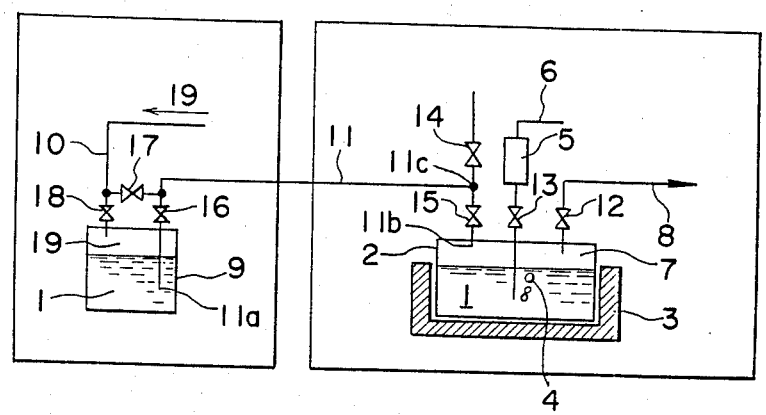
FIG. 1 is a schematic view of a prior art gas supplying apparatus (already referred to)
Figure 2:
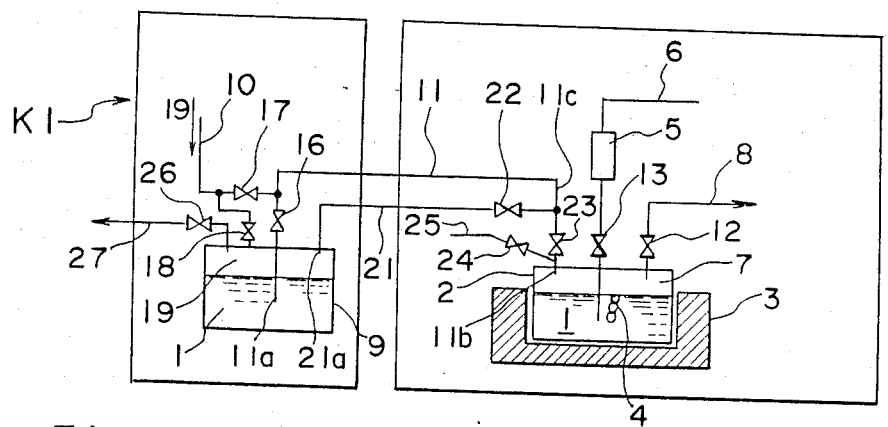
FIG. 2 is a schematic view of a gas supplying apparatus according to a first embodiment of the present invention.

Referring now to the drawings, there is shown in FIG. 2, a gas supplying apparatus for supplying gaseous raw material 7 of optical fiber to an optical fiber reaction apparatus, according to the first embodiment of the present invention. The apparatus K1 includes a main vessel 2 containing liquid raw material 1 of the optical fiber, a constant temperature bath 3, a pipe 6 provided with a flow regulator 5, a pipe 8, an auxiliary vessel 9 containing the liquid raw material 1 for replenishment, a pipe 10 for feeding pressurized nitrogen gas 19 therethrough into the auxiliary vessel 9, a main pipe 11 having an inlet end 11a and an outlet end 11b, and control valves 12 and 13 and 16 to 18 in the same manner as in the prior art gas supplying apparatus of FIG. 1, with the exception of the control valves 14 and 15 of the prior art gas supplying apparatus of FIG. 1. Namely, since the main vessel 2 is secured to a bottom portion of the constant temperature bath 3 directly or through a support base, the liquid raw material 1 stored in the main vessel 2 is maintained at a predetermined temperature. Carrier gas 4 is introduced, through the pipe 6 dipped into the liquid raw material 1 of the main vessel 2, into the liquid raw material 1 of the main vessel 2 so as to bubble the liquid raw material 1. Thus, the carrier gas 4 is mixed with the liquid raw material 1 to a saturated state or an almost saturated state so as to be formed into the gaseous raw material 7. The gaseous raw material 7 is supplied to the optical fiber reaction apparatus via the pipe 8. Since the carrier gas 4 is not necessarily required to bubble the liquid raw material 1, it can be also so arranged that the carrier gas 4 is simply introduced over a liquid level of the liquid raw material 1 in the main vessel 2 so as to be mixed with vapor of the liquid raw material 1 into the gaseous raw material 7. The inlet end 11a of the main pipe 11 is dipped in the liquid raw material 1 stored in the auxiliary vessel 9, while the outlet end 11b of the main pipe 11 is disposed in the main vessel 2 and above the liquid level of the liquid raw material 1 in the main vessel 2.

Furthermore, the apparatus K1 includes a return pipe 21 provided with a control valve 22, a control valve 23, a pipe 25 provided with a control valve 24, and a pipe 27 provided with a control valve 26. The return pipe 21 is branched, in the vicinity of the outlet end 11b, from a branch portion 11c of the main pipe 11. A distal end 21a of the return pipe 21 is disposed in the auxiliary vessel 9 and above a liquid level of the liquid raw material 1 in the auxiliary vessel 9. Meanwhile, the control valve 23 is provided between the branch portion 11c and the outlet end 11b of the main pipe 11. Furthermore, the pipe 25 is connected with the main pipe 11 so as to be led between the control valve 23 and the outlet end 11b. On the other hand, the pipe 27 is connected with the auxiliary vessel 9.

In the apparatus K1 of the above described arrangement in order to replenish the main vessel 2 with the liquid raw material 1 stored in the auxiliary vessel 9, the control valves 17, 22, 24 and 26 are closed and the control valves 16, 18 and 23 are opened, while the pressurized nitrogen gas 19 is fed into the auxiliary vessel 9 through the pipe 10. Thus, the liquid raw material 1 stored in the auxiliary vessel 9 is carried into the main vessel 2 via the main pipe 11. When a predetermined amount of the liquid raw material 1 in the auxiliary vessel 9 has been fed into the main vessel 2, the control valves 16, 18, 23 and 24 are closed and the control valves 17, 22 and 26 are opened, so that supply of the liquid raw material 1 of the auxiliary vessel 9 to the main vessel 2 is stopped and the liquid raw material 1 remaining in the main pipe 11 is returned, through the return pipe 21, to the auxiliary vessel 9. At this time, since the distal end 21a of the return pipe 21 is disposed above the liquid level of the liquid raw material 1 in the auxiliary vessel 9, the liquid raw material 1 in the auxiliary vessel 9 is prevented, after the liquid raw material 1 remaining in the main pipe 11 has been returned to the auxiliary vessel 9, from being bubbled by the pressurized nitrogen gas 19 injected from the distal end 21a.

Thereafter, when the control valve 24 is opened, the liquid raw material 1 remaining in the main pipe 11 between the control valve 23 and the outlet end 11b is carried into the main vessel 2. Meanwhile, since an amount of the liquid raw material 1 remaining in the main pipe 11 between the control valve 23 and the outlet end 11b is quite small compared with a total replenishment amount of the liquid raw material 1, the total replenishment amount of the liquid raw material 1 is substantially determined by an amount of the liquid raw material 1 fed at the time when the control valve 23 is opened.

Since the total replenishment amount of the liquid raw material 1 is substantially determined by the amount of the liquid raw material 1 fed at the time when the control valve 23 is opened in the apparatus K1 as described above, it becomes easy to accurately set the total replenishment amount of the liquid raw material 1 at a target value even if the main pipe 11 varies in length or diameter.

Figure 3:
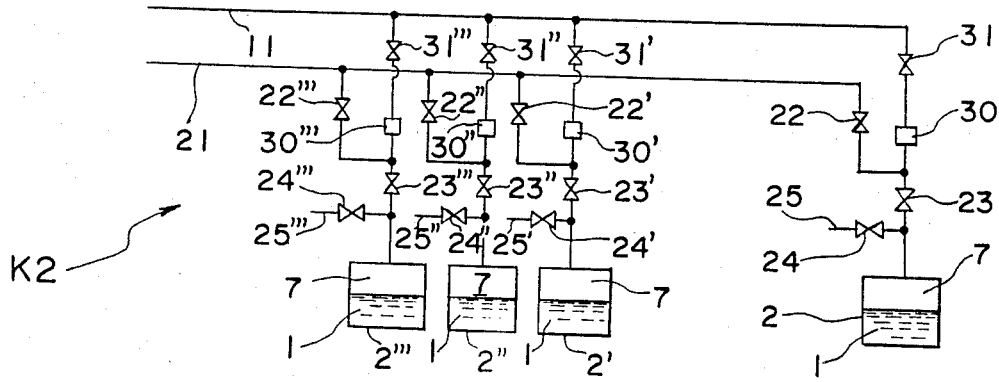
FIG. 3 is a fragmentary schematic view of a gas supplying apparatus according to a second embodiment of the present invention.

Referring to FIG. 3, there is shown a gas supplying apparatus K2 according to the second embodiment of the present invention, in which a plurality of main vessels 2, 2', 2" and 2'" are replenished with the liquid raw material 1 in the single auxiliary vessel 9 (not shown). The main vessels 2, 2', 2" and 2'" are connected, through flow regulators 30, 30', 30" and 30'" and opening and closing valves 31, 31', 31" and 31'", with the main pipe 11, respectively. Meanwhile, it is so arranged that the gaseous raw material 7 generated in the main vessles 2, 2', 2" and 2'" is supplied to the optical fiber reaction apparatus through pipes (not shown). In the apparatus K2, since feeding pressure of the pressurized nitrogen gas 19 for feeding the liquid raw material 1 to the main vessels 2, 2', 2" and 2'" becomes higher at spots in the main pipe 11 as the spots come closer to the auxiliary vessel 9, i.e. becomes lower at spots in the main pipe 11 as the spots are moved further away from the auxiliary vessel 9, differences in the replenishment amount of the liquid raw material 1 to the respective main vessels 2, 2', 2" and 2'" due to differences in the feeding pressure of the pressurized nitrogen gas 19 at the spots in the main pipe 11 are eliminated by using the flow regulators 30, 30', 30" and 30'" such that each of the main vessels 2, 2', 2" and 2'" is replenished with a target amount of the liquid raw material 1 accurately. Furthermore, the apparatus K2 includes the return pipe 21, control valves 22, 22', 22" and 22'", control valves 23, 23', 23" and 23'" and control valves 24, 24', 24" and 24'" and pipes 25, 25', 25" and 25'" in the same manner as in the apparatus K1. Since other constructions of the apparatus K2 are similar to those of the apparatus K1, detailed description thereof is abbreviated for the sake of brevity.

Hereinbelow, operations of replenishing the main vessels 2, 2', 2" and 2'" with the liquid raw material 1 in the auxiliary vessel 9 (not shown) in the apparatus K2 will be described with reference to FIGS. 4 to 8. It is to be noted here that closed valves are totally smudged while open valves are not smudged, i.e. are illustrated in a blank manner in FIGS. 4 to 8.

Figure 4:
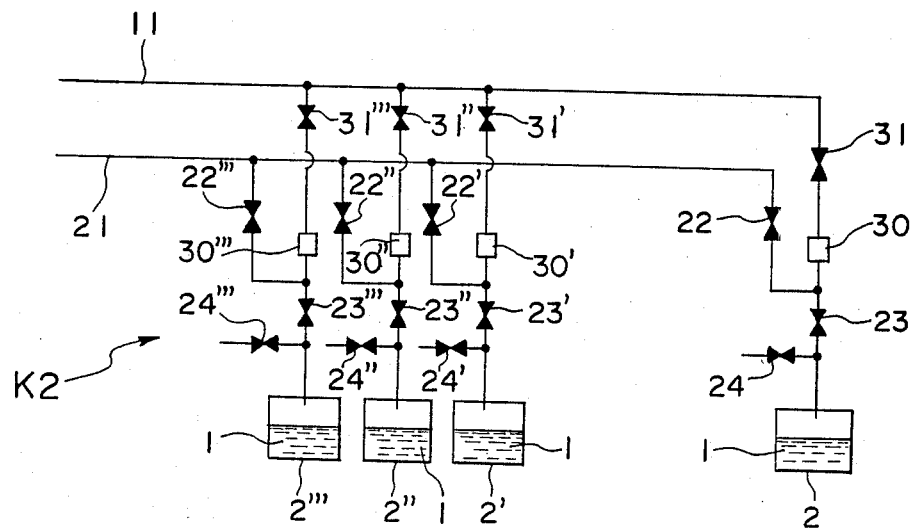
FIGS. 4 to 8 are views explanatory of operations of the gas supplying apparatus of FIG. 3.
Figure 5:
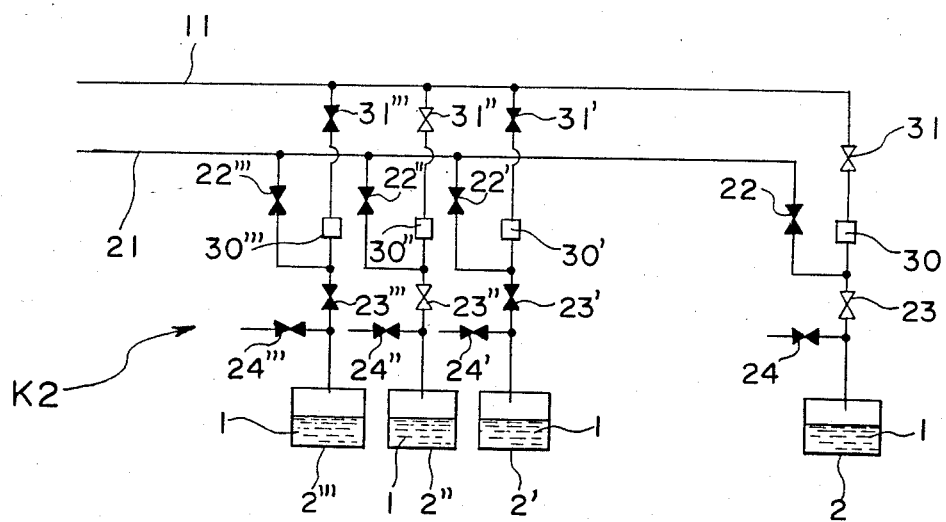
Figure 6:
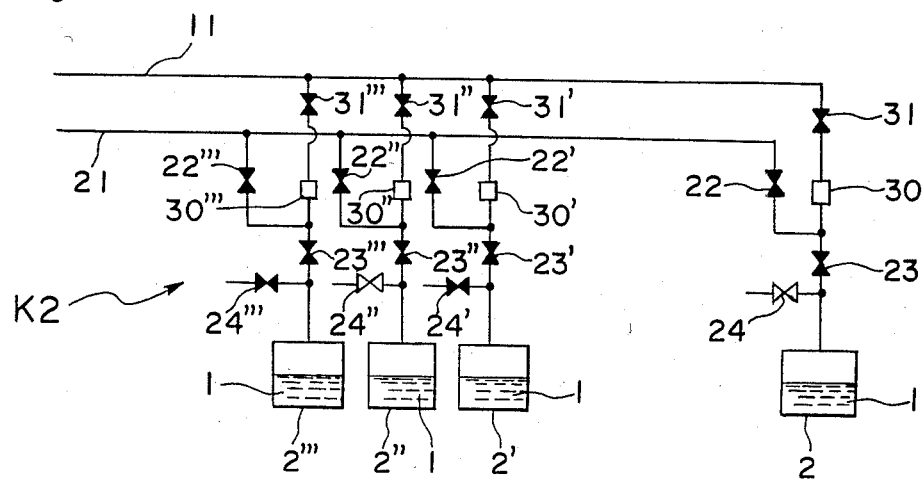

When the main valves 2, 2', 2" and 2'" are not replenished with the liquid raw material 1, all the valves are closed as shown in FIG. 4. In order to replenish the main vessel 2 and 2" with the liquid raw material 1, the opening and closing valves 31 and 31" and the control valves 23 and 23" are opened. Thus, the liquid raw material 1 fed under pressure through the main pipe 11 is simultaneously carried into the main vessels 2 and 2". In order to stop replenishment of the liquid raw material 1 into the main vessels 2 and 2", the opening and closing valves 31 and 31" and the control valves 23 and 23" are closed as shown in FIG. 6. Subsequently, when the control valves 24 and 24" are opened, the liquid raw material 1 remaining in the main pipe 11 between the control valve 23 and the main vessel 2 and between the control valve 23" and the main vessel 2" is forced into the main vessels 2 and 2", whereby replenishment of the liquid raw mateial 1 into the main vessels 2 and 2" is completed.

Figure 7:
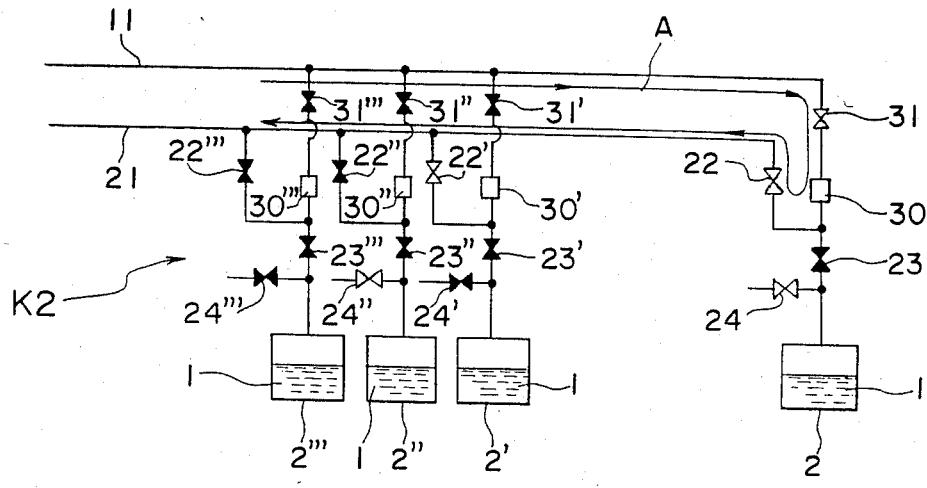
Figure 8:
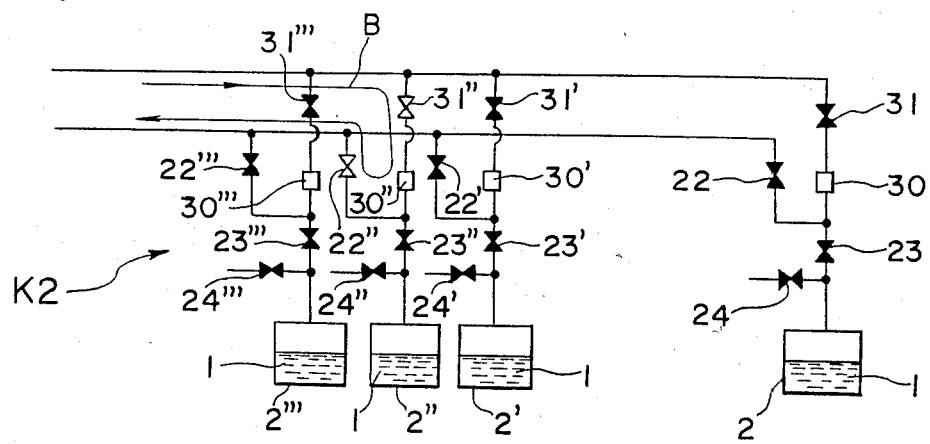

In order to return to the auxiliary vessel 9 the liquid raw material 1 remaining in the main pipe 11, the opening and closing valve 31 and the control valve 22 are initially opened as shown in FIG. 7 so as to feed the liquid raw material 1 under pressure in a path A in FIG. 7. Hereafter, the opening and closing valve 31" and the control valve 22" are opened as shown in FIG. 8 so as to feed the liquid raw material 1 under pressure in a path B in FIG. 8. Thus, since the liquid raw material 1 is fed under pressure to the auxiliary vessel 9 sequentially in order of decreasing distance relative to the auxiliary vessel 9, the liquid raw material 1 is sufficiently returned to the auxiliary vessel 9 without remaining in the main pipe 11 and the return pipe 21.

Accordingly, in the apparatus K2, it becomes possible to replenish each of the main vessels 2, 2', 2" and 2'" with the target amount of the liquid raw material 1 accurately. Furthermore, in the apparatus K2, it becomes possible to simultaneously replenish a plurality of the main vessels 2, 2', 2" and 2'" with the liquid raw material 1, thereby increasing operating efficiency of the gas supplying apparatus. Moreover, since the main pipe 11 and the return pipe 21 can be used, in common, for the main vessels 2, 2', 2" and 2'", piping of the gas supplying apparatus can be performed easily.

Meanwhile, although the pressurized nitrogen gas is used for replenishing the main vessel with the liquid raw material in the apparatuses K1 and K2, a pump or any other feed means can also be used in place of the pressurized nitrogen gas. However, even in this case, pressurized gas is required to be used for returning to the auxiliary vessel the liquid raw material remaining in the main pipe. In addition, it is needless to say that the present invention can be applied not only to the gas supplying apparatus for supplying the gaseous raw material of the optical fiber but to any other gas supply apparatus.

As is clear from the foregoing description, in accordance with the present invention, the main vessel can be replenished with the target amount of the liquid raw material accurately and efficiently.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A gas supplying apparatus for supplying gaseous raw material of an article to a processing apparatus, comprising:

at least one main vessel for storing liquid raw material of said article, which generates said gaseous raw material constituted by vapor of said liquid raw material mixed with carrier gas drawn into said main vessel so as to supply said gaseous raw material to said processing apparatus;

an auxiliary vessel for storing liquid raw material replenishment for said liquid raw material;

a main pipe for delivering to said main vessel said liquid raw material replenishment stored in said auxiliary vessel, which has an inlet end and an outlet end;

said inlet end being dipped in said liquid raw material replenishment in said auxiliary vessel, while said outlet end is disposed in said main vessel;

a return pipe having a distal end, which is branched, in the vicinity of said outlet end, from a branch portion of said main pipe such that said distal end is disposed in said auxiliary vessel and above a liquid level of said liquid raw material replenishment in said auxiliary vessel;

a first control valve which is provided in said return pipe;

a second control valve which is provided, between said outlet end and said branch portion, in said main pipe; and a feed means for feeding, through said main pipe, to said main vessel said liquid raw material replenishment in said auxiliary vessel.

2. A gas supplying apparatus as claimed in claim 1, wherein said feed means is pressurized gas introduced into said auxiliary vessel.

3. A gas supplying apparatus as claimed in clam 1, wherein said feed means is a pump.

4. A gas supplying apparatus as claimed in claim 1, wherein said article is optical fiber and said processing apparatus is an optical fiber reaction apparatus.

5. A gas supplying apparatus as claimed in claim 2, wherein said article is optical fiber and said processing apparatus is an optical fiber reaction apparatus.

6. A gas supplying apparatus as claimed in claim 3, wherein said article is optical fiber and said processing apparatus is an optical fiber reaction apparatus.

7. A gas supplying apparatus as claimed in claim 1, wherein a plurality of said main vessels are provided so as to be replenished with said liqid raw material replenishment in said auxiliary vessel.

8. A gas supplying apparatus as claimed in claim 7, wherein said feed means is pressurized gas introduced into said auxiliary vessel.

9. A gas supplying apparatus as claimed in claim 7, wherein said feed means is a pump.

10. A gas supplying apparatus as claimed in claim 7, wherein said article is optical fiber and said processing apparatus is an optical fiber reaction apparatus.

11. A gas supplying apparatus as claimed in claim 8, wherein said article is optical fiber and said processing apparatus is an optical fiber reaction apparatus.

12. A gas supplying apparatus as claimed in claim 9, wherein said article is optical fiber and said processing apparatus is an optical fiber reaction apparatus.

* * * * *